(12) United States Patent
Tu et al.

(10) Patent No.: US 8,314,015 B2
(45) Date of Patent: Nov. 20, 2012

(54) SILICON SURFACE MODIFICATION FOR THE ELECTROCHEMICAL SYNTHESIS OF SILICON PARTICLES IN SUSPENSION

(75) Inventors: Chang-Ching Tu, Seattle, WA (US); Liang Tang, Vancouver, WA (US); Apostolos T. Voutsas, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 306 days.

(21) Appl. No.: 12/836,030

(22) Filed: Jul. 14, 2010

(65) Prior Publication Data

US 2012/0015501 A1 Jan. 19, 2012

Related U.S. Application Data

(63) Continuation-in-part of application No. 12/835,974, filed on Jul. 14, 2010.

(51) Int. Cl.
*H01L 21/20* (2006.01)
(52) U.S. Cl. ... 438/478; 438/497; 438/500; 257/E21.09; 257/E21.092
(58) Field of Classification Search ............ 438/478, 438/497, 500, 503, 507; 257/E21.09, E21.092, 257/E21.114, E21.115
See application file for complete search history.

(56) References Cited

U.S. PATENT DOCUMENTS

| 6,585,947 | B1 | 7/2003 | Nayfeh et al. | |
| 7,294,449 | B1 * | 11/2007 | Gudeman et al. | 430/270.1 |
| 2002/0070121 | A1 * | 6/2002 | Nayfeh et al. | 205/549 |
| 2003/0170162 | A1 | 9/2003 | Nayfeh et al. | |
| 2009/0053536 | A1 * | 2/2009 | Kunze et al. | 428/446 |
| 2009/0311875 | A1 * | 12/2009 | Rogojina | 438/765 |
| 2010/0221544 | A1 * | 9/2010 | Baumer et al. | 428/404 |

FOREIGN PATENT DOCUMENTS

| CA | 2388815 | 5/2001 |
| JP | 2003515459 | 5/2003 |
| WO | WO 0138222 | 5/2001 |

OTHER PUBLICATIONS

Jillina M. Buriak, "Organometallic Chemistry on Silicon and Germanium Surfaces", Department of Chemistry, Indiana, May 2002.*
Kang et al., "A Polyoxometalate-Assisted Electrochemical Method for Silicon Nanostructures Preparation", J. Am. Chem. Soc., 129, 5326-5327, 2007.
Nayfeh at al., "Uniform Delivery of Silicon Nanoparticles on Device quality substrates using spin coating from isopropyl alcohol colloids", Appl. Phys. Lett., 94, 043112, 2009.
Kang et al., "Water-Soluable Silicon Quantum Dots with Wavelength-Tnable Photoluminescence", Adv. Mater., 2009 21, 661-664.

* cited by examiner

*Primary Examiner* — David Vu
*Assistant Examiner* — Duy T Nguyen
(74) *Attorney, Agent, or Firm* — Law Office of Gerald Maliszewski; Gerald Maliszewski

(57) ABSTRACT

A process of silicon (Si) surface modification is provided for the electrochemical synthesis of Si particles in suspension. The process begins with a Si first substrate with a surface, and forms Si particles attached to the surface. Hydrogen-terminated Si particles are created and the first substrate is immersed in a hexane/1-octene (1/1 volume ratio) solution with a catalytic amount of chloroplatinic acid ($H_2PtCl_6$). 1-octene is bonded with the hydrogen-terminated Si particles, creating modified Si particles, with octane capping ligands, attached to the substrate surface. The first substrate is then exposed to ultrasonication, separating the modified Si particles from the first substrate. After removing the first substrate, a suspension is created of modified Si particles suspended in excess hexane/1-octene.

19 Claims, 3 Drawing Sheets

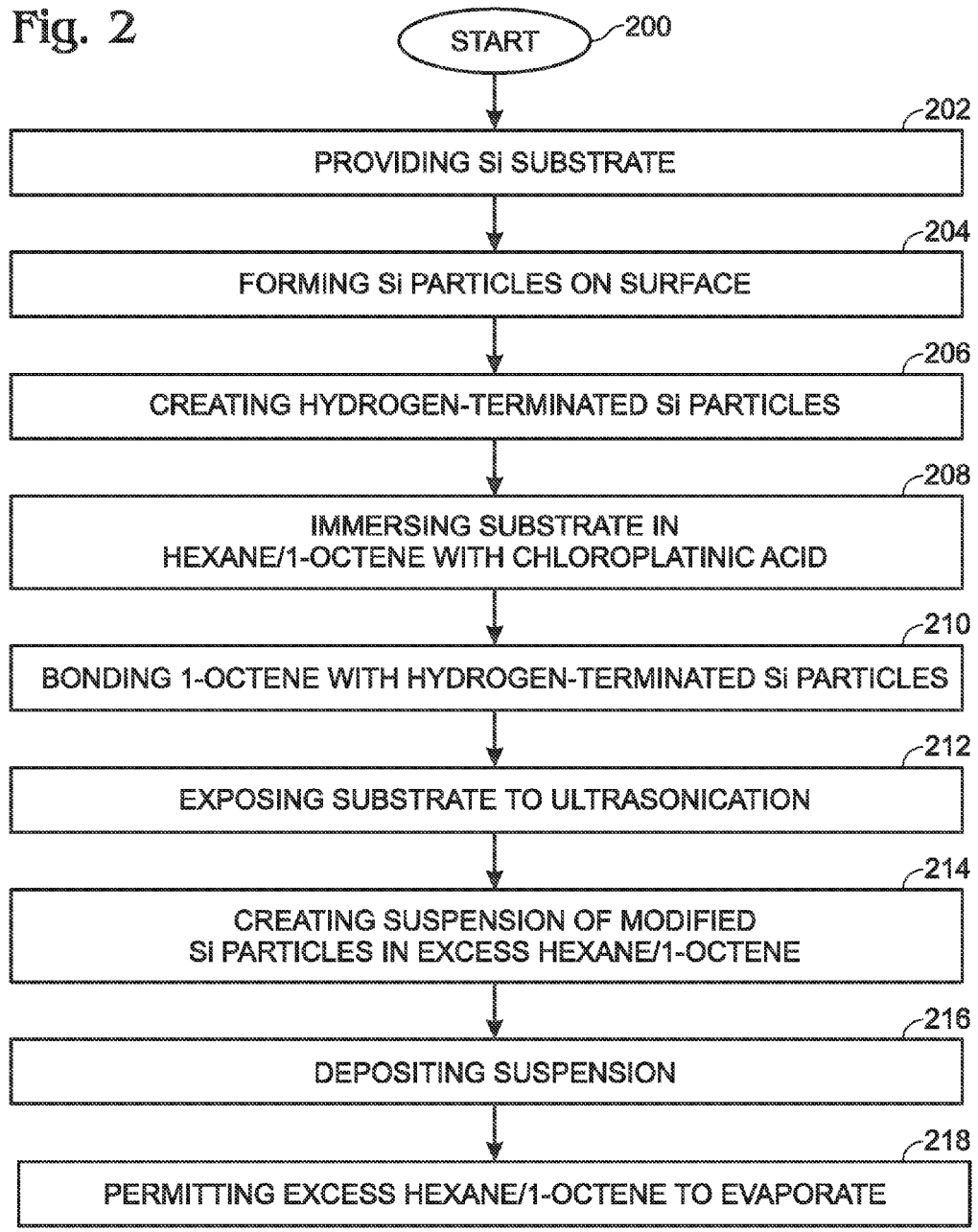

SILICON SURFACE MODIFICATION FOR THE ELECTROCHEMICAL SYNTHESIS OF SILICON PARTICLES IN SUSPENSION

RELATED APPLICATIONS

This application is a Continuation-in-Part of a pending application entitled, COLLOIDAL-PROCESSED SILICON PARTICLE DEVICE, invented by Jiandong Huang et al, Ser. No. 12/835,974, filed on Jul. 14, 2010, which is incorporated herein by reference.

BACKGROUND OF THE INVENTION

1. Field of the Invention

This invention generally relates to integrated circuit (IC) fabrication and, more particularly, to a method for synthesizing a silicon (Si) nanoparticle solution suitable for deposition of Si nanoparticles.

2. Description of the Related Art

The electrochemical etching of Si wafers in an electrolyte containing hydrofluoric acid, methanol, and some catalysts can generate nano/micro structures on the wafer surface. The porous Si surface is then pulverized in an ultrasonication bath to produce Si nanoparticles, as reported in J. Am. Chem. Soc., 129, pp. 5326-5327, 2007. Without oxidation or other surface passivation, the as-synthesized Si nanoparticles should be hydrogen-terminated, which makes the particles not soluble in several organic solvents that are commonly used for spin-coating, drop-casting or inkjet printing. Currently, the Si nanoparticles synthesized from solution-based precursor reduction methods demonstrate versatile surface chemistry due to their chemically active surface termination (e.g., chloride, bromide, and hydride) that allows for subsequent derivatization. However, no solution-based chemical method has been found for cost-effective industrial production owing to the need for a critical synthesis condition, special equipment, and complex purification procedures.

It would be advantageous if there was an electrochemical etching method, which only required commercially available Si wafers, common electrolytes, and performance in an ambient condition, that could be used to synthesize Si nanoparticles directly from bulk Si wafers (n- or p-type), for low-cost, large-quantity and high-throughput applications.

SUMMARY OF THE INVENTION

Disclosed herein is a method able to modify an electrochemically synthesized silicon (Si) nanoparticle surface with alkyl ligands by hydrosilylation in one step, without any further purification procedures. The resulting Si nanoparticle suspension in hexane/1-octene is readily processed by spin-coating, drop-casting, screen-printing, or inkjet-printing to fabricate thin film devices.

The 1-octene molecules are attached to the hydrogen-terminated porous Si wafer surface through a hydrosilylation reaction at room temperature, with only a catalytic amount of catalyst (chloroplatinic acid). The octane-modified Si wafer surface is then pulverized in an ultrasonication bath to produce Si nanoparticles. The fabrication process requires only common chemicals, household power, and an ambient environment. Compared to solution-based chemical synthesis methods, which usually require expensive reagents, a critical environment, and complicated reactions, the disclosed method is a relatively low cost way to fabricate Si nanoparticle thin films.

The hexane/1-octene solvent mixture is both the reacting agent for surface modification and the suspension medium for Si nanoparticle dispersion. Therefore, there is no additional step of transferring nanoparticles to the desired organic solvent, or further procedures to purify the nanoparticle suspension. Since the surface modification takes place when the nanoparticles are still connected on the Si wafer surface, the reaction is very controllable and easy to observe.

Accordingly, a process of silicon (Si) surface modification is provided for electrochemically synthesized Si particles in suspension. The process begins with a Si first substrate with a surface, and forms Si particles attached to the surface. Hydrogen-terminated Si particles are created and the first substrate is immersed in a hexane/1-octene (1/1 volume ratio) solution with a catalytic amount of chloroplatinic acid ($H_2PtCl_6$). 1-octene is bonded with the hydrogen-terminated Si particles, creating modified Si particles, with octane capping ligands, attached to the substrate surface. The first substrate is then exposed to ultrasonication, separating the modified Si particles from the first substrate. After removing the first substrate, a suspension is created of modified Si particles in excess hexane/1-octene.

For example, the Si particles may be formed by electrochemically etching the first substrate surface. In one aspect, the process creates hydrogen-terminated Si particles, subsequent to electrochemically etching, by treating the first substrate surface with about 20% hydrofluoric acid (HF). The 1-octene can be bonded with the hydrogen-terminated Si particles at room temperature, with shaking, by immersing the first substrate in hexane/1-octene for about 12 hours.

Additional details of the above-described process, and a process using a non-polar highly evaporative solvent with alkene, are provided in more detail below.

BRIEF DESCRIPTION OF THE DRAWINGS

FIG. 2 is a flowchart illustrating an alternate process of Si surface modification for the electrochemical synthesis of Si particles in suspension.

DETAILED DESCRIPTION

Figure 1:
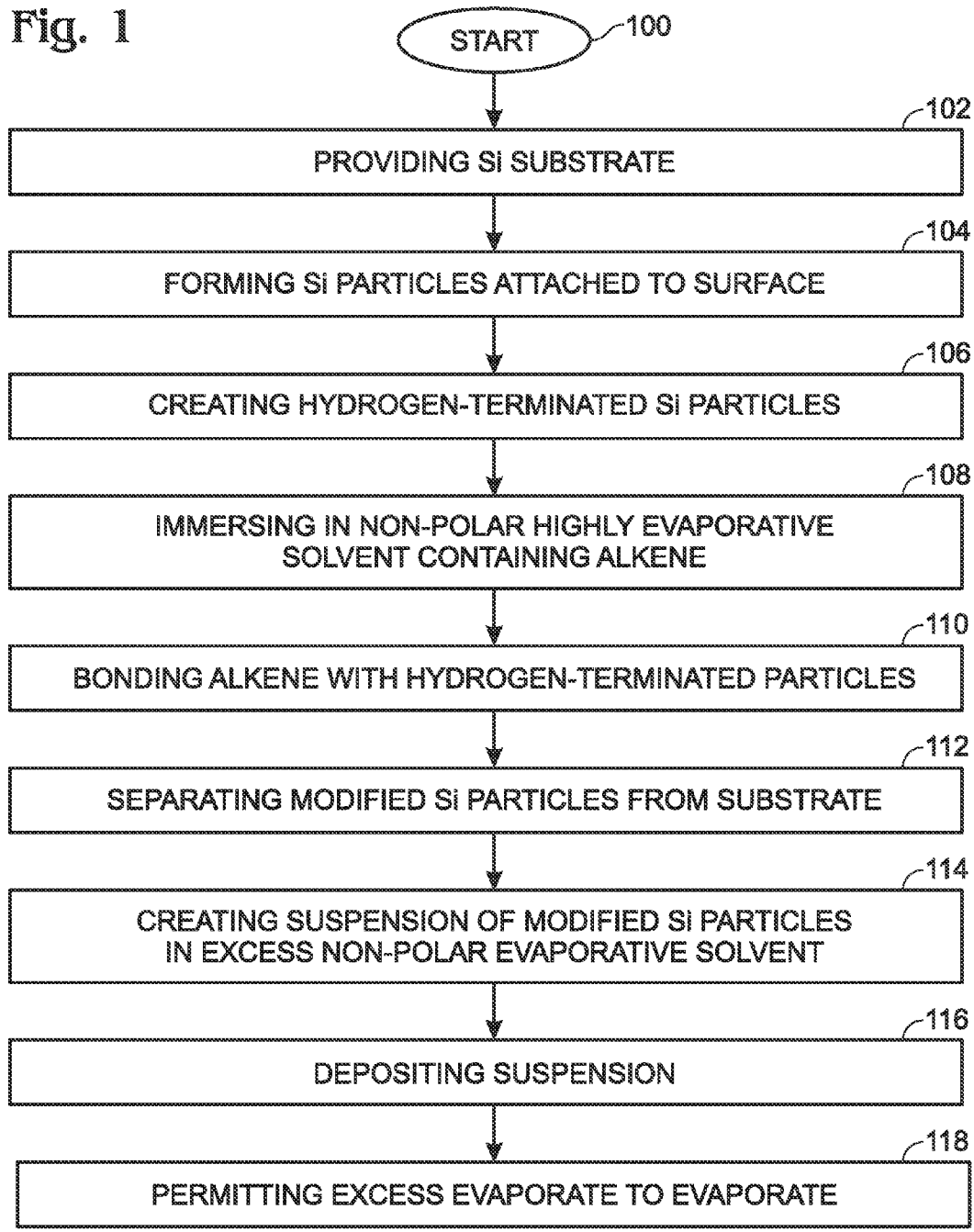
FIG. 1 is a flowchart illustrating a process of silicon (Si) surface modification for the electrochemical synthesis of Si particles in suspension.

FIG. 1 is a flowchart illustrating a process of silicon (Si) surface modification for the electrochemical synthesis of Si particles in suspension. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the steps are performed in numerical order. The method starts at Step 100.

Step 102 provides a Si first substrate with a surface. The first substrate may be intrinsic, or doped (n- or p-type). Step 104 forms Si particles attached to the surface. In one aspect, Step 104 electrochemically etches the first substrate surface. Step 106 creates hydrogen-terminated Si particles. In one aspect, Step 106 treats the first substrate surface with about 20% hydrofluoric acid (HF), subsequent to electrochemically etching in Step 104. Step 108 immerses the first substrate in a non-polar highly evaporative solvent containing alkene. In one aspect, Step 108 immerses in hexane/1-octene (1/1 volume ratio) solution with a catalytic amount of chloroplatinic acid ($H_2PtCl_6$). In another aspect, Step 108 immerses the first substrate in hexane/1-octene for about 12 hours.

Octane is a hydrocarbon and an alkane with the chemical formula $CH_3(CH_2)_6CH_3$. Octane has many structural isomers that differ by the amount and location of branching in the carbon chain. As with all low-molecular weight hydrocarbons, octane and its isomers are very flammable. Octane has 18 structural isomers (24 including stereoisomers).

Octene is an alkene with the formula $C_8H_{16}$. Several isomers of octene are known, depending on the position of the double bond and the branching of the carbon chain. The simplest isomers is 1-octene, an alpha-olefin used primarily as a co-monomer in production of polyethylene via the solution polymerization process. Several useful octenes are obtained by dimerization of isobutene and 1-butene. These branched alkenes are used to alkylate phenols to give precursors to detergents.

Step 110 bonds the alkene with the hydrogen-terminated Si particles, creating modified Si particles, with alkene capping ligands, attached to the substrate surface. In one aspect, 1-octene is bonded with the hydrogen-terminated Si particles at room temperature, with shaking. Step 112 exposes the first substrate to ultrasonication, separating the modified Si particles from the first substrate. After removing the first substrate, Step 114 creates a suspension of modified Si particles in the excess non-polar evaporate solvent.

Step 116 deposits the suspension on a second substrate. The suspension may be deposited using a process such as spin-coating, drop-casting, screen printing, or inkjet printing. In one aspect, the second substrate is a flexible plastic. Step 118 permits the excess non-polar highly evaporative solution to evaporate.

In another aspect, creating hydrogen-terminated Si particles in Step 106 includes creating a combination of hydrogen-terminated Si nanoparticles and hydrogen-terminated Si microparticles. Then, creating the suspension of modified Si particles in the excess non-polar evaporate solution (Step 114) includes creating a combination of Si nanoparticles and Si microparticles.

FIG. 2 is a flowchart illustrating an alternate process of Si surface modification for the electrochemical synthesis of Si particles in suspension. The process begins at Step 200. Step 202 provides a Si first substrate with a surface. The first substrate may be intrinsic, or doped (n- or p-type). Step 204 forms Si particles attached to the surface. In one aspect, Step 204 electrochemically etches the first substrate surface. Step 206 creates hydrogen-terminated Si particles. In one aspect, subsequent to electrochemically etching, Step 206 treats the first substrate surface with about 20% hydrofluoric acid (HF). Step 208 immerses the first substrate in a hexane/1-octene (1/1 volume ratio) solution with a catalytic amount of chloroplatinic acid ($H_2PtCl_6$). In another aspect, Step 208 immerses the first substrate in hexane/1-octene for about 12 hours. Step 210 bonds 1-octene with the hydrogen-terminated Si particles, creating modified Si particles, with octane capping ligands, attached to the substrate surface. In one aspect, 1-octene is bonded with the hydrogen-terminated Si particles at room temperature, with shaking.

Step 212 exposes the first substrate to ultrasonication, separating the modified Si particles from the first substrate. After removing the first substrate, Step 214 creates a suspension of modified Si nanoparticles in excess hexane/1-octene. Step 216 deposits the suspension on a second substrate. The suspension may be deposited using a process such as spin-coating, drop-casting, screen printing, or inkjet printing. In one aspect, the second substrate is a flexible plastic. Step 218 permits the excess hexane/1-octene to evaporate.

In another aspect, creating hydrogen-terminated Si particles in Step 206 includes creating a combination of hydrogen-terminated Si nanoparticles and hydrogen-terminated Si microparticles. Then, creating the suspension of modified Si particles in the excess hexane/1-octene (Step 214) includes creating a combination of Si nanoparticles and Si microparticles.

In contrast with the hexane/1-octene (1/1 volume ratio) explicitly described in the explanation of FIG. 2, the process described by FIG. 1 is based upon any combination of highly evaporative non-polar solvent which has alkene as one of its composition. The unsaturated double bond of alkene is necessary for the occurrence of the hydrosilylation reaction.

Since the surface modification takes place when the nanoparticles are still connected on the Si wafer surface (Steps 104 and 204 above), the reaction is very controllable and easy to observe. In experiments, a control blank Si wafer (without etching) is placed in parallel with the electrochemically etched Si wafer when the surface modification reaction is in process. By observing the water droplet contact angle on the control Si wafer, it can be concluded whether the surface modification is successful. The successfully octane-modified Si wafer should have respective advancing and receding water contact angles of 109° and 98° from literature.

The surface modification of Si nanoparticles can enhance air stability by preventing oxidation, increase solubility in a variety of solvents, provide connections to organic materials such as proteins for labeling application, and influence the optical properties of nanoparticles. Recently, electrochemically etched Si nanoparticles with hydrogen-termination have shown suspension with low level agglomeration in isopropyl alcohol, as reported in Appl. Phys. Lett., Vol. 94, 043112, 2009. After controlled oxidation, the electrochemically etched Si nanoparticles can also become water-soluble, rendering their widespread application in biological fields, as reported in Adv. Mater., Vol. 21, pp. 661-664.

Disclosed herein is a preparation method for octane-terminated Si nanoparticles synthesized by electrochemical etching. Due to the capping ligands, the nanoparticles form a stable suspension in non-polar organic solvents, and can be solution-processed by spin-coating, drop-casting, or inkject printing to fabricate thin films.

Figure 3A:
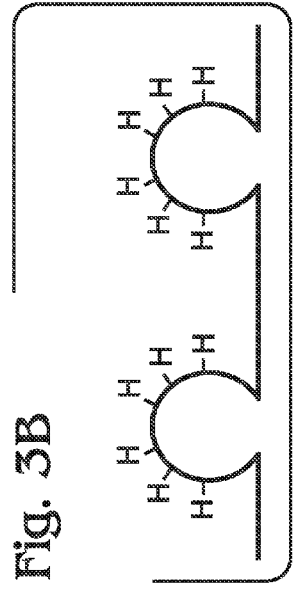
FIGS. 3A through 3E illustrate steps in an octane-terminated Si nanoparticle synthesis process.
Figure 3B:
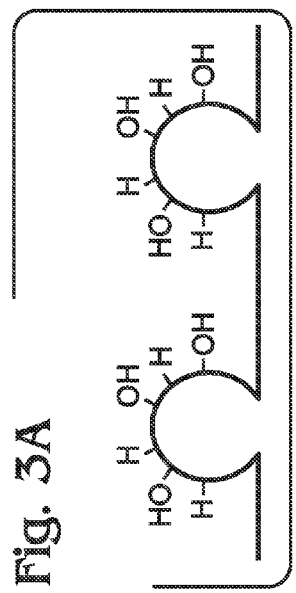
Figure 3C:
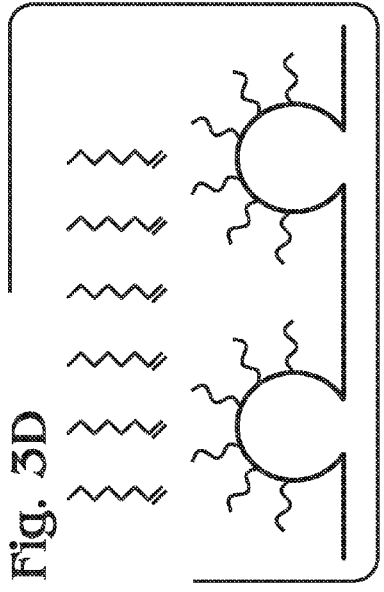
Figure 3D:
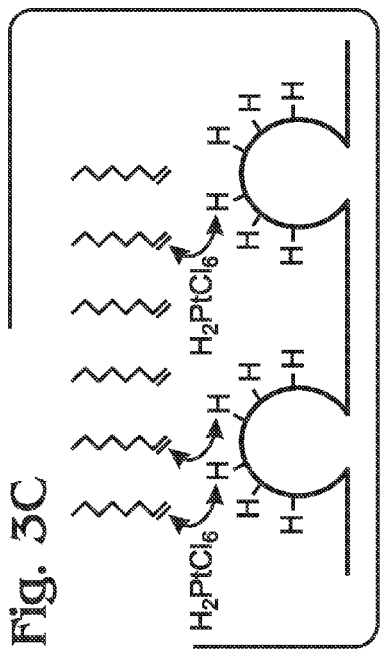

FIGS. 3A through 3E illustrate steps in an octane-terminated Si nanoparticle synthesis process. In FIG. 3A, after electrochemical etching, Si nanoparticles are formed on the wafer surface. During the etching and storage, some part of Si particle surface changes from hydrogen-termination to oxide-termination due to oxidation. In FIG. 3B, prior to surface modification reaction (hydrosilylation), the porous Si surface is treated with 20% HF to remove oxide and make the surface thoroughly hydrogen-terminated. Subsequently in FIG. 3C, the Si wafer is immersed in 1-octene solution with catalytic amount of chloroplatinic acid ($H_2PtCl_6$). The unsaturated double bond of 1-octene reacts with the hydride on the Si surface, becoming octane capping ligands. Due to the presence of catalyst, the reaction is performed in room temperature with orbital shaking overnight (about 12 hours). In FIG. 3D, due to the excess presence of 1-octene, the hydrosilylation continues until the whole surface becomes octane-terminated.

Figure 3E:
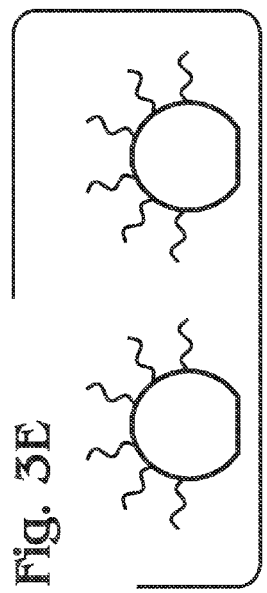

Subsequently in FIG. 3E, the Si wafer immersed in hexane/1-octene is pulverized by ultrasonication. Now, the hexane/1-octene becomes the suspension medium for the Si nanoparticles coming off the Si wafer surface. Due to the octane capping, the nanoparticles are well-dispersed and ready for solution-processing (spin-coating, drop-casting, screen-printing, or inkject-printing).

In another variation, the process electrochemically etches p-type boron-lightly-doped Si wafers with (100) orientation and 5-20 ohm-cm resistivity in a mixture of HF, methanol, $H_2O_2$, and polyoxometalates (POMs), where the latter two function as catalyst. At high current density (>10 mA/cm$^2$) and an etching time of several hours, the typical etched surface structures are micropores having a diameter of about 2 microns (μm). Generally, more microstructures are found close to the meniscus region (air-liquid interface), as a result of gradually decreasing current density away from the liquid surface. In proper etching conditions, an electrochemically etched Si surface should be mostly hydrogen-terminated, as suggested by Fourier-transform infrared spectroscopy (FTIR) data in the literature, and should become hydrophobic. For more saturated hydrogen-passivation and removal of carbon and oxide residues, the etched Si wafer can be treated in 20% HF for 4 minutes prior to further steps.

Hydrogen-terminated surface can be converted to an alkyl-termination for stable surface passivation. Here the unsaturated double bond of 1-octene is utilized to react with the hydrogen-terminated Si surface through hydrosilylation reaction, with chloroplatinic acid as a catalyst, resulting in octane-modified Si surface. After the surface modification, the porous Si wafer is immersed in hexane/1-octene (1/1) as a dispersion medium, and is ultra-sonicated for 5 minutes. Experimentally, it has been determined that without the hydrosilylation reaction, the Si nano/micro particle composites can suspend for only a few minutes after ultra-sonication. After a few minutes, they begin to agglomerate into millimeter-size precipitates. However, the octane-modified composites are kept in suspension for several days without obvious aggregation.

The suspensions show orange photoluminescence under 365 nanometer (nm) ultra-violet (UV) light excitation. Without the surface modification, Si nanoparticles in hexane are severely agglomerated and big clusters attach to the vial side wall. However, for octane-modified Si nanoparticles, the suspension shows stable and uniform dispersion for several days after ultrasonication.

Because of the above-mentioned stable and uniform dispersion, a suspension of octane-modified Si particles permits large area thin films to be fabricated by screen-printing or inkjet-printing from the same Si nano/micro particle suspension in hexane/1-octene. To increase the area density of assembled particles, multiple micro droplets (5-10 μL) are cast on the same region in the manner that one droplet after the other evaporates. For example, 10-times drop-casting results in a much denser thin film than 1-time drop-casting. The same method can be applied to spin-coating and inkject-printing.

Two effective ways to increase the coverage of Si nano/micro particles include multiple drop-casting and condensing of the suspension by ultra-sonicating a larger area of etched Si wafer, into a smaller volume of solvent. For example, approximately 3 cm$^2$ of etched Si wafer can be dispersed in 1 mL of the 1-octene/hexane solvent, and drop-cast.

Processes have been provided herein for the electrochemical synthesis of Si particles in suspension. Examples of particular solvents and particle fabrication steps have been given to illustrate the invention. However, the invention is not limited to merely these examples. Other variations and embodiments of the invention will occur to those skilled in the art.

We claim:

1. A process of silicon (Si) surface modification for the electrochemical synthesis of Si particles in suspension, the process comprising:
   providing a Si first substrate with a surface;
   forming Si particles attached to the surface;
   creating hydrogen-terminated Si particles;
   immersing the first substrate in a non-polar highly evaporative solvent containing alkene;
   bonding the alkene with the hydrogen-terminated Si particles, creating modified Si particles, with alkene capping ligands, attached to the substrate surface;
   exposing the first substrate to ultrasonication, separating the modified Si particles from the first substrate; and,
   after removing the first substrate, creating a suspension of the modified Si particles in the excess non-polar highly evaporative solvent.

2. The process of claim 1 wherein forming Si particles attached to the surface includes electrochemically etching the first substrate surface.

3. The process of claim 2, wherein creating hydrogen-terminated Si particles includes, subsequent to electrochemically etching, treating the first substrate surface with about 20% hydrofluoric acid (HF).

4. The process of claim 1 wherein immersing the first substrate in a non-polar highly evaporative solvent includes immersing in hexane/1-octene (1/1 volume ratio) solution with a catalytic amount of chloroplatinic acid ($H_2PtCl_6$).

5. The process of claim 4 wherein bonding alkene with the hydrogen-terminated Si particles includes bonding 1-octene with the hydrogen-terminated Si particles at room temperature, with shaking.

6. The process of claim 5 wherein immersing the first substrate in the non-polar highly evaporative solvent includes immersing the first substrate in the hexane/1-octene for about 12 hours.

7. The process of claim 1 further comprising:
   depositing the suspension on a second substrate;
   permitting the excess non-polar highly evaporative solution to evaporate.

8. The process of claim 7 wherein depositing the suspension on the second substrate includes deposition the suspension using a process selected from a group consisting of spin-coating, drop-casting, screen printing, and inkjet printing.

9. The process of claim 1 wherein creating hydrogen-terminated Si particles includes creating a combination of hydrogen-terminated Si nanoparticles and hydrogen-terminated Si microparticles; and,
   wherein creating the suspension of modified Si particles in the excess non-polar highly evaporative solution includes creating a combination of Si nanoparticles and Si microparticles.

10. The process of claim 7 wherein depositing the suspension on the second substrate includes depositing on a plastic substrate.

11. A process of silicon (Si) surface modification for the electrochemical synthesis of Si particles in suspension, the process comprising:
   providing a Si first substrate with a surface;
   forming Si particles attached to the surface;
   creating hydrogen-terminated Si particles;
   immersing the first substrate in a hexane/1-octene (1/1 volume ratio) solution with a catalytic amount of chloroplatinic acid ($H_2PtCl_6$);

bonding 1-octene with the hydrogen-terminated Si particles, creating modified Si particles, with octane capping ligands, attached to the substrate surface;

exposing the first substrate to ultrasonication, separating the modified Si particles from the first substrate; and, after removing the first substrate, creating a suspension of the modified Si particles in the excess hexane/1-octene.

12. The process of claim 11 wherein forming Si particles attached to the surface includes electrochemically etching the first substrate surface.

13. The process of claim 12 wherein creating hydrogen-terminated Si particles includes, subsequent to electrochemically etching, treating the first substrate surface with about 20% hydrogen fluoride (HF).

14. The process of claim 11 wherein bonding 1-octene with the hydrogen-terminated Si particles includes bonding 1-octene with the hydrogen-terminated Si particles at room temperature, with shaking.

15. The process of claim 14 wherein immersing the first substrate in the hexane/1-octene includes immersing the first substrate in the hexane/1-octene for about 12 hours.

16. The process of claim 11 further comprising:
depositing the suspension on a second substrate;
permitting the excess hexane/1-octene to evaporate.

17. The process of claim 16 wherein depositing the suspension on the second substrate includes depositing the suspension using a process selected from a group consisting of spin-coating, drop-casting, screen printing, and inkjet printing.

18. The process of claim 11 wherein creating hydrogen-terminated Si particles includes creating a combination of hydrogen-terminated Si nanoparticles and hydrogen-terminated Si microparticles; and, wherein creating the suspension of the modified Si particles in the excess hexane/1-octene includes creating a combination of Si nanoparticles and Si microparticles.

19. The process of claim 16 wherein depositing the solution on the second substrate includes depositing on a plastic substrate.

* * * * *